United States Patent [19]
Martin

[11] Patent Number: 5,926,708
[45] Date of Patent: Jul. 20, 1999

[54] METHOD FOR PROVIDING MULTIPLE GATE OXIDE THICKNESSES ON THE SAME WAFER

[75] Inventor: Dale W. Martin, Hyde Park, Vt.

[73] Assignee: International Business Machines Corp., Armonk, N.Y.

[21] Appl. No.: 08/859,588

[22] Filed: May 20, 1997

[51] Int. Cl.$^6$ .............................................. H01L 21/8242
[52] U.S. Cl. ........................ 438/241; 438/275; 438/299
[58] Field of Search ........................... 438/241, 275–279, 438/299, 300

[56] References Cited

U.S. PATENT DOCUMENTS

| | | | |
|---|---|---|---|
| 3,731,161 | 5/1973 | Yamamoto | 317/235 |
| 4,627,153 | 12/1986 | Masuoka | 29/571 |
| 4,649,638 | 3/1987 | Fang et al. | 29/590 |
| 5,371,026 | 12/1994 | Hayden et al. | 437/41 |
| 5,426,065 | 6/1995 | Chan et al. | 437/52 |
| 5,432,114 | 7/1995 | O | 437/56 |
| 5,434,093 | 7/1995 | Chau et al. | 437/41 |
| 5,480,828 | 1/1996 | Hsu et al. | 437/56 |
| 5,502,009 | 3/1996 | Lin | 437/239 |
| 5,532,181 | 7/1996 | Takebuchi et al. | 437/43 |
| 5,576,226 | 11/1996 | Hwang | 437/24 |
| 5,670,402 | 9/1997 | Sogawa et al. | 437/48 |

FOREIGN PATENT DOCUMENTS 0 308 316 A1  3/1989  European Pat. Off. .

*Primary Examiner*—Joni Chang
*Attorney, Agent, or Firm*—Eugene I. Shkurko

[57] ABSTRACT

The present invention is directed to a method of manufacturing an integrated circuit with two or more gate oxide thicknesses on the same wafer. The method includes the steps of growing a first oxide layer on a substrate, depositing a first polysilicon layer over the first oxide layer, applying a block mask, etching the first polysilicon layer, stripping the block mask, stripping the first oxide layer from the areas opened by the block mask, growing a second oxide layer, depositing a second polysilicon layer, and polishing the second polysilicon layer to remove the second polysilicon layer from everywhere except the areas opened by the block mask. If desired, a polish stop layer may be deposited after depositing the first polysilicon layer. Threshold implants may also be made after the block mask is stripped. Finally, polysilicon shapes may be added to the boundary areas opened by the block mask to help eliminate foreign material problems.

6 Claims, 3 Drawing Sheets

METHOD FOR PROVIDING MULTIPLE GATE OXIDE THICKNESSES ON THE SAME WAFER

FIELD OF THE INVENTION

The invention relates to the field of integrated circuit manufacturing, and, more particularly, to a method for providing multiple gate oxide thicknesses on the same wafer.

BACKGROUND OF THE INVENTION

In order to increase the density and performance of integrated circuits (ICs), device sizes are becoming smaller and operating voltages are becoming lower. This creates a problem in that these more advanced ICs are often required to interface with older technology ICs, such as I/O devices. The older technology ICs typically operate at voltages above those sustainable for the gate oxides of the more advanced ICs. In other words, the higher operating voltages of the older technology ICs are not compatible with the lower operating voltages of the more advanced ICs. The gate oxide of a lower voltage device cannot withstand the higher voltage of an older technology device, and thus wears out much too quickly.

The solution is to provide a way in which two or more gate oxide thicknesses can be produced on the same wafer. Thin oxide devices can be produced to implement high-speed advanced logic, and thicker oxide devices can be produced to interface with older technology devices.

Two prior art processes currently exist which allow two gate oxide thicknesses to be produced on the same wafer. The first process includes growing an oxide of a first thickness, applying photoresist, and then etching away the oxide any place where a thinner film is desired. This results in some areas with an oxide already in place, and some areas that are just bare silicon. Next, a second oxide is grown on the wafer. The areas that already had some oxide in place now have an even thicker oxide, and the areas that were just bare silicon have an oxide that is only as thick as the second oxide layer. The result is two gate oxide thicknesses on the same wafer, where the thicknesses can be adjusted as necessary. The problem with this prior art approach is that photoresist processing is performed on top of the first oxide and next to the bare silicon where the second oxide is going to be grown. This tends to be a very defective process.

A second prior art process for providing two gate thicknesses on the same wafer includes the following steps:

1. Grow a first gate oxide layer.
2. Deposit a first poly-silicon layer.
3. Apply a block mask.
4. Etch away the first poly-silicon layer and the first gate oxide (note that the etching is done wherever the second gate oxide type is desired).
5. Strip the block mask.
6. Grow a second gate oxide layer.
7. Deposit a second poly-silicon layer.
8. Apply a block mask.
9. Etch away the second poly-silicon layer and the second gate oxide wherever it is desired that the first poly-silicon layer be the gate contact.
10. Strip the block mask.
11. Continue with normal wafer processing.

While the second prior art approach does not create the number of process defects found in the first prior art approach, it can be an expensive and time-consuming process. Accordingly, it would be desirable to have a less expensive method for creating two or more gate oxide thicknesses on the same wafer. It would also be desirable to have a method which is less prone to process defects.

SUMMARY OF THE INVENTION

Accordingly, the present invention is directed to a method of manufacturing an integrated circuit with two or more gate oxide thicknesses on the same wafer. The method includes the steps of growing a first oxide layer on a substrate, depositing a first polysilicon layer over the first oxide layer, applying a block mask, etching the first polysilicon layer, stripping the block mask, stripping the first oxide layer from the areas opened by the block mask, growing a second oxide layer, depositing a second polysilicon layer, and polishing the second polysilicon layer to remove the second polysilicon layer from everywhere except the areas opened by the block mask. If desired, a polish stop layer may be deposited after depositing the first polysilicon layer. Threshold implants may also be made after the block mask is stripped. Finally, polysilicon shapes may be added to the boundary areas opened by the block mask to help eliminate foreign material problems.

One advantage of the present invention is that it is less prone to process defects than the methods found in the prior art. Another advantage of the present invention is that it is a less expensive manufacturing process than is found in the prior art.

BRIEF DESCRIPTION OF THE DRAWINGS

The foregoing and other features and advantages of the present invention will become more apparent from the detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

The method of the present invention may be used to create multiple gate oxide thicknesses on the same wafer. This allows devices with different gate oxides thicknesses, and therefore different operating voltages, to be created on the same IC. The invention will be described with reference to creating two different types of transistors on the same IC, although the method of the present invention may be used to create multiple (i.e. more than two) gate oxide thicknesses on the same wafer. In the described embodiment, one type of transistor will be a high-voltage transistor, which will be used as an I/O device to communicate with an older (i.e. higher voltage) chip. The other type of transistor will be used for high-speed, low-voltage advanced logic. Thus, the I/O transistor will need to have a thicker gate oxide than the advanced logic transistor.

Figure 1:
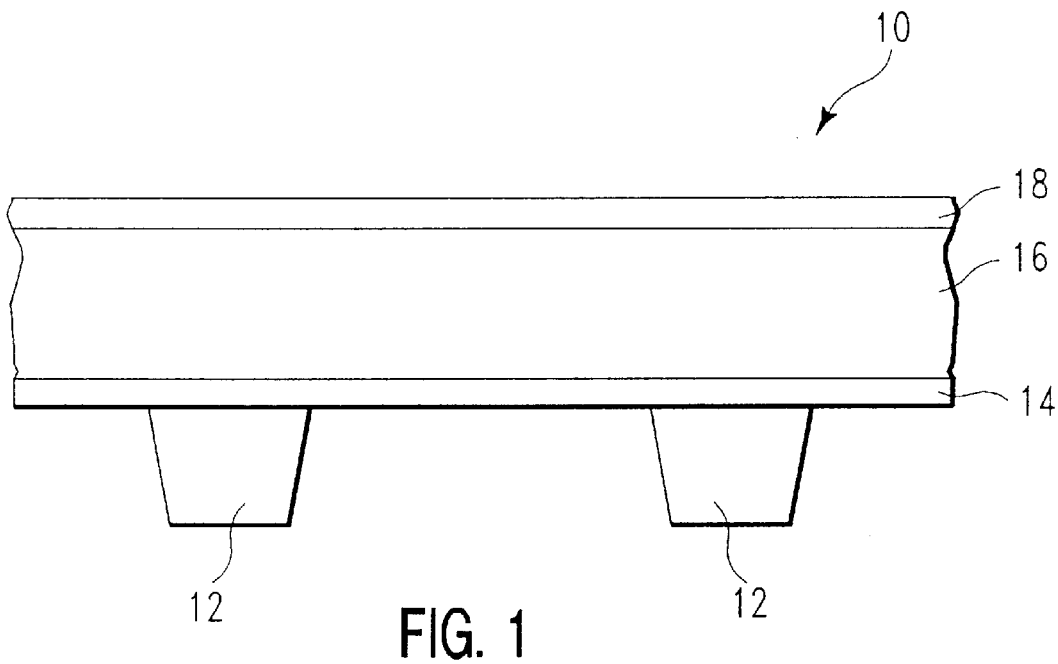
FIG. 1 depicts the steps of growing a first oxide, depositing a first polysilicon layer, and depositing a polish stop film to a wafer.
Figure 3:
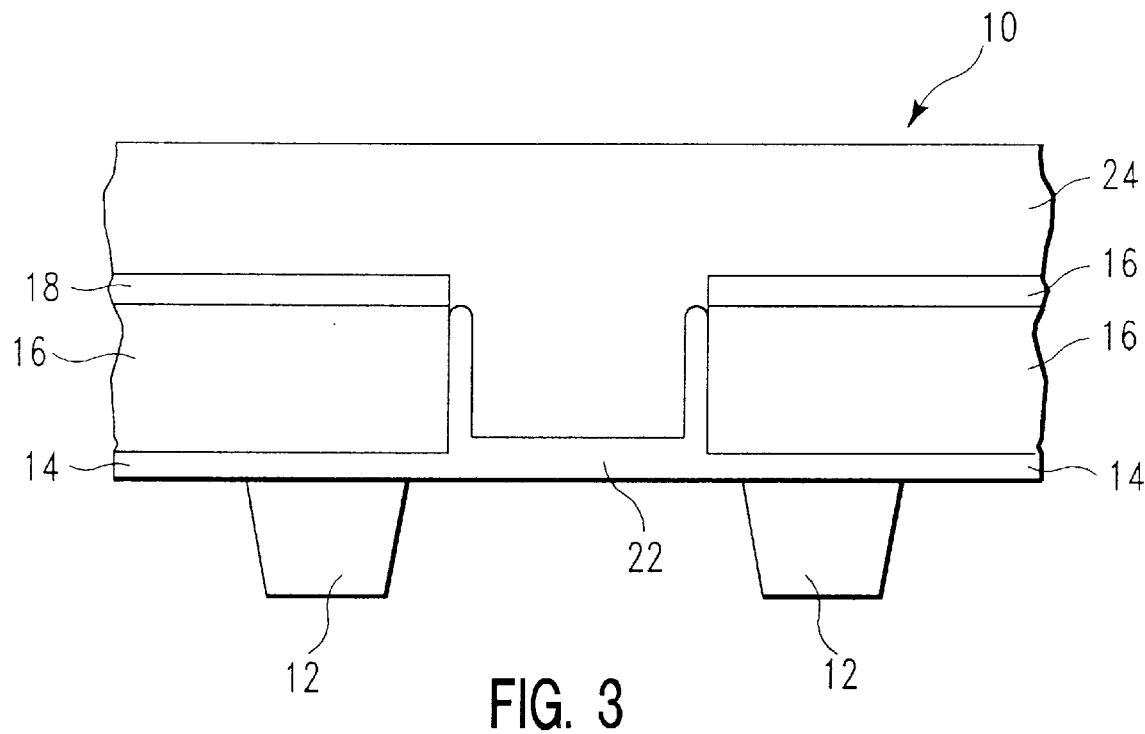
FIG. 3 depicts the steps of stripping the masking layer, stripping the first oxide from the I/O windows, growing the second oxide layer, and depositing gate conductor material for an I/O device.
Figure 4:
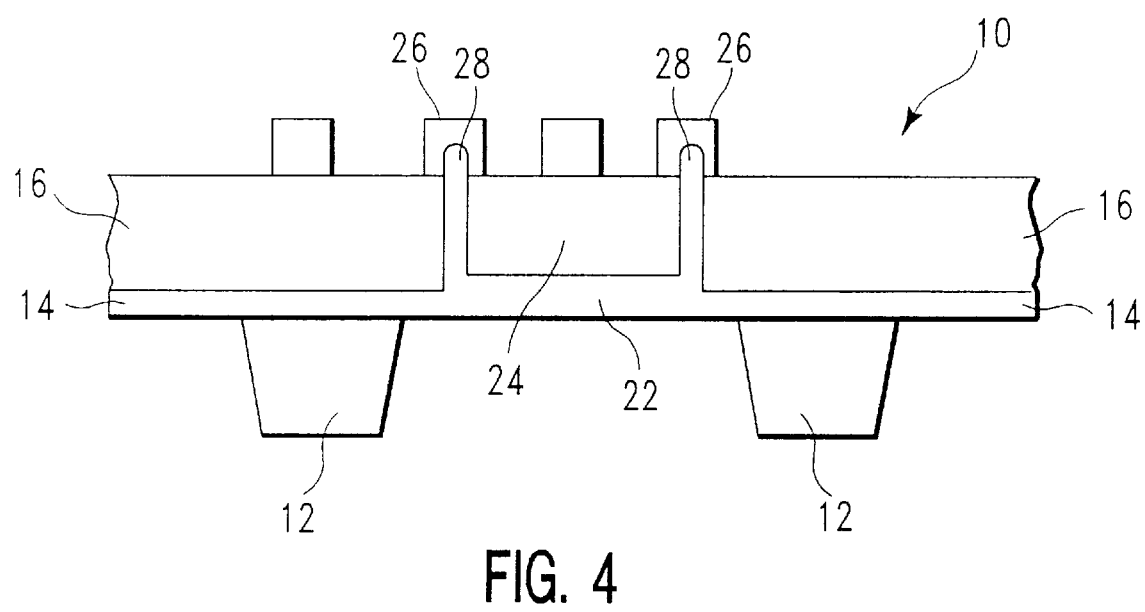
FIG. 4 depicts the steps of polishing the wafer such that the I/O gate conductor is removed from non-I/O areas, stripping the polish stop film, and applying a standard PC mask.
Figure 5:
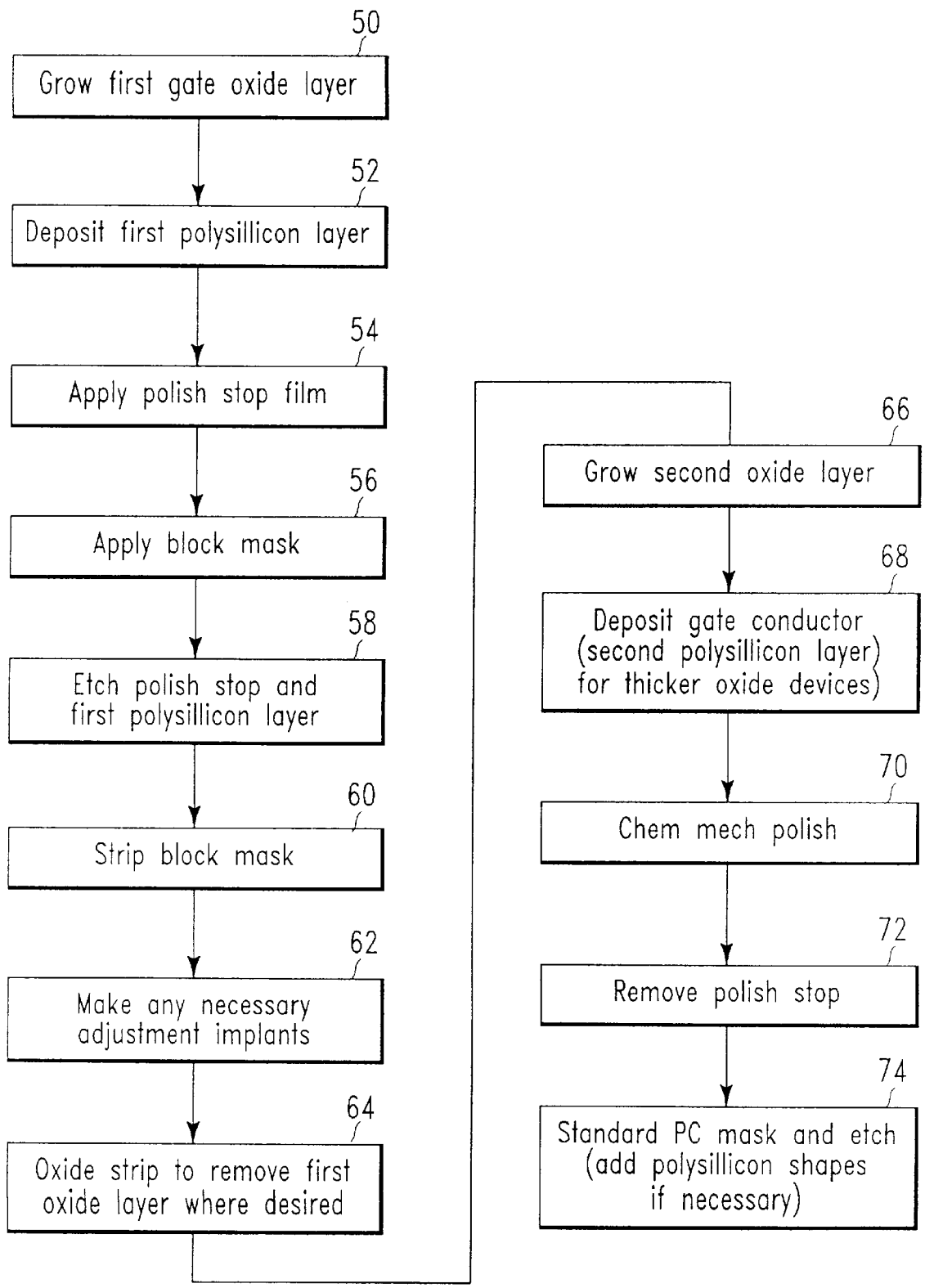
FIG. 5 is a flow chart, depicting the steps detailed in FIGS. 1 through 4.

FIGS. 1 through 4 illustrate the steps of the present invention, while FIG. 5 depicts the steps of the present invention in a flowchart. Referring now to FIG. 1, wafer 10 is depicted. As shown in FIG. 1, isolation oxides 12 have already been grown. Also, assume that any necessary n-well and p-well implanting has been performed. As shown in FIG. 1, a first gate oxide layer 14 is grown (step 50 in FIG. 5). This will be the gate oxide for the high-speed, low-voltage transistor. Next, a first polysilicon layer 16 is deposited (step 52), and then polish stop film 18 is applied (step 54). Any polish stop film may be used. One example of a polish stop film which may be applied is silicon nitride.

Figure 2:
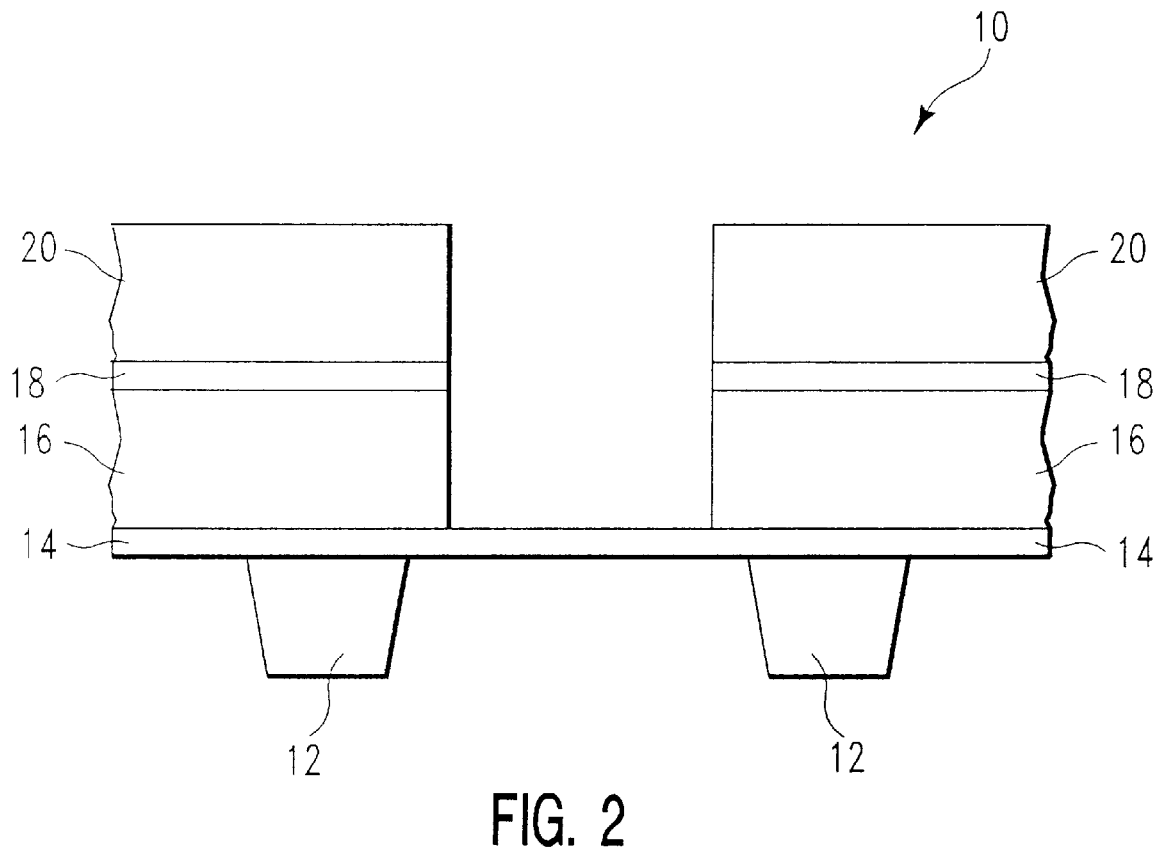
FIG. 2 depicts the steps of applying an I/O block mask and etching the polish stop and first polysilicon layer.

Referring now to FIG. 2, block mask 20 (also referred to as photoresist) is applied to open the areas where the thicker oxide is desired (step 56). As will become apparent, the openings produced by block mask 20 are limited in size in order to prevent dishing when performing the chemical-mechanical (chem-mech) polish described below with reference to FIG. 4. Preferably, block mask 20 will be designed such that the etch which occurs next does not expose any of isolation oxide 12. After block mask 20 is applied, polish stop 18 and polysilicon 16 are etched down to the underlying gate oxide 14 (step 58), and block mask 20 is stripped (step 60). At this point, any threshold adjustment implants required may be made (step 62), either as a blanket implant if a single device type is used (i.e. either n-channel or p-channel), or by masks and implants if multiple device types are required.

Referring now to FIG. 3, wafer 10 is next processed through an oxide strip to remove the first oxide layer from the area where the I/O device (i.e. the thicker gate oxide device) will be (step 64). Then a second oxide layer 22 is grown (step 66). This will be the gate oxide for the I/O device. Next, gate conductor material 24 is deposited for the I/O device (step 68). Gate conductor material 24 can be any material which meets the following criteria:

1. The material has a sufficient polish rate differential to polish stop 18 in order to allow planarization.

2. The material can be polished at the desired dimensions without excessive dishing (i.e. thinning below the level of the polish stop material).

3. The material can be patterned with a standard gate conductor etch.

One such material that meets all of the above requirements is silicon-germanium. It is also possible that the material used may be the same type of polysilicon layer applied for the high-speed, low-voltage device (polysilicon layer 16).

Referring now to FIG. 4, the next step is a chem-mech polish (step 70). The chem-mech polish removes gate conductor material 24 from all areas but the I/O devices, and insures that the surface is level from polysilicon layer 16 to gate conductor material 24. Preferably, the size of the openings for the I/O devices is not ⋮⋮large, ⋮⋮ and thus the resulting film for the I/O devices will be compatible with later PC mask and etch processing of the high-speed, low-voltage devices. As discussed above with reference to FIG. 2, minimizing the I/O opening sizes improves the thickness uniformity by eliminating dishing by the polishing process into the I/O silicon. Note that dishing is the tendency of the chem-mech polish process to deviate from a planar surface when polishing large areas of material as compared to small areas of the same material. Ideally, the polish pad ensures perfect planarity, and the process will result in a surface where the top of the remaining polysilicon will be the same height as the polish stop film. In reality, the polish pad is not perfectly rigid, and the result can be a surface where the remaining polysilicon will be lower than the polish stop. Restricting the size of the openings in the polish stop layer reduces the amount of this thinning.

After the chem-mech polish is complete, the wafer is processed through a hot phosphoric acid, or some other process, which will remove polish stop 18 (step 72). At this point, wafer 10 goes to the standard PC mask and etch process (step 74).

There is one additional step which may be added to the PC mask process if necessary. This step is also depicted in FIG. 4. It may be necessary to add polysilicon shapes 26 to the PC mask, such that polysilicon shapes 26 surround the boundary line of the original I/O mask shape (step 74). The reason for this is that there will be an oxide grown on the polysilicon during the I/O gate oxidation step. This oxide will be resistant to the standard PC etch, which by design is selective to oxide films. If no provision is made for this, it is possible that oxide fences 28 will be exposed by PC etch. These oxide fences could break off and cause foreign material (FM) problems later. Thus, polysilicon shapes 26 entomb fences 28 and reduce the chances of FM problems.

The method of the present invention has several advantages over the prior art methods. Because the surface of the wafer is never exposed to resist strip processing, standard precleans may be used. The gate surfaces of the high-speed, low-voltage devices are exposed to minimal temperature changes, resulting in minimal effects on the threshold implants. The thickness tolerances of both types of devices can be tightly controlled. Finally, this process allows for an added threshold adjust without the need for masking in the case where a single device type is used.

Although the invention has been described with a certain degree of particularity, it should be recognized that elements thereof may be altered by persons skilled in the art without departing from the spirit and scope of the invention. The invention is limited only by the following claims and their equivalents.

What is claimed is:

1. A method of manufacturing an integrated circuit, comprising the steps of:

growing a first oxide layer on a substrate;

depositing a first polysilicon layer over the first oxide layer;

masking the first polysilicon layer by applying a block mask with one or more openings over the first polysilicon layer;

etching the first polysilicon layer from one or more areas determined by the openings in the block mask;

stripping the block mask;

stripping the first oxide layer from the areas opened by the block mask;

growing a second oxide layer;

depositing a second polysilicon layer; and polishing the second polysilicon layer to remove the second polysilicon layer from everywhere except the areas opened by the block mask.

2. A method according to claim 1, wherein said polishing step comprises the step of performing a chemical-mechanical polish.

3. A method according to claim 1, further comprising the steps of:

depositing a polish stop layer after said step of depositing a first polysilicon layer; and removing the polish stop layer after said polishing step.

4. A method according to claim 3, wherein said step of etching the first polysilicon layer comprises the step of etching the polish stop and the first polysilicon layer from one or more areas determined by the openings in the block mask.

5. A method according to claim 1, further comprising the step of making one or more threshold adjustment implants after said step of stripping the block mask.

6. A method according to claim 1, further comprising the step of adding one or more polysilicon shapes to a boundary area defined by an area around the area opened by the block mask.

* * * * *